United States Patent [19]
Sid-Ahmed et al.

[11] Patent Number: 5,245,433
[45] Date of Patent: Sep. 14, 1993

[54] 2-D REAL-TIME SEMI-SYSTOLIC FILTER APPARATUS FOR HDTV

[76] Inventors: Maher A. Sid-Ahmed, 12703 Riverside Dr. E., Tecumseh, Ontario, Canada, N8N 1A7; Herbert J. Kaufman, 1084 Marjorie Dr., Windsor, Ontario, Canada, N8S 4A3

[21] Appl. No.: 889,673

[22] Filed: May 28, 1992

[51] Int. Cl.$^5$ .............................................. H04N 5/14
[52] U.S. Cl. .................................. 358/160; 358/166; 345/29
[58] Field of Search ................ 358/160, 21 R, 37, 36, 358/166, 167; 340/720, 733, 812, 813; 364/724.01, 724.05, 825; 333/165, 166

[56] References Cited

U.S. PATENT DOCUMENTS

5,122,788  6/1992  Sid-Ahmed et al. ................ 340/720

OTHER PUBLICATIONS

M. J. J. C. Annegarn et al., "Digital Signal Processing in Television Receivers", Philips Tech. Rev. 42, No. 6/7, 183-200, Apr. 1986.
A. N. Venetsanopoulos et al., "High-Speed Architectures for Digital Image Processing", IEEE Trans. on Circuits and Systems, vol. CAS-34, No. 8, 887-895, Aug. 1987.
J. H. Arbeiter et al., "A Two-Dimensional Real-Time Video Pyramid Processor", RCA Review, vol. 47, 3-31, Mar. 1986.
M. A. Sid-Ahmed, "Realization of Z-D IIR Filters Using Sample-and-Hold Circuitry", 1991 IEEE International Symposium on circuits and Systems, vol. 5, Jun. 1991, pp. 2467-2470.

*Primary Examiner*—James J. Groody
*Assistant Examiner*—Sherrie Hsia

[57] ABSTRACT

An apparatus for 2-D filtering a raster scanned image at high real-time rates such as those required for HDTV, with either IIR of FIR structures, without the need for expensive digital systems that require A/D and D/A converters. The wide variety of 2-D signal processing techniques (e.g. high pass filtering) that are based on a 2-D transfer function of general order can be implemented. The use of a semi-systolic structure allows a number of advantages for VLSI implementation such as modularity, regularity and high parallelism. Use of analog components in the processing elements of the apparatus makes high-speed operation for real-time applications in HDTV possible. The apparatus is applicable to TV imaging in general including such areas as advanced television systems, industrial and biomedical video systems.

9 Claims, 12 Drawing Sheets

2-D REAL-TIME SEMI-SYSTOLIC FILTER APPARATUS FOR HDTV

BACKGROUND OF THE INVENTION

In the development of new receivers for television, more advanced signal processing techniques will be implemented in the circuitry of the video processing section. It has been proposed that such advanced video signal processing can be carried out by high-speed two-dimensional (2-D) spatial filtering or by three-dimensional (3-D) temporal filters. See for example, "Digital Signal Processing in Television Receivers" by M. J. J. C. Annergarn, A. H. H. J. Nillesen, and J. G. Raven, Philips Tech. Rev. 42, No. 6/7, 183–200, April 1986. Newer receivers will display pictures that have higher pixel resolution. For what has been termed High Definition Television (HDTV), if the processing is done in real-time, that is, at the same rate as the effective sampling rate of the picture, processing rates in excess of 80 million pixels/sec would be required (e.g. 1000 lines/field×50 fields/sec, 5:3 aspect ratio).

In the past analog signal processing techniques such as noise coring, edge peaking, and comb filter separation of luminance and chrominance signals have been based on one-dimensional time domain approaches implemented as simple Finite Impulse Response (FIR) signal processing structures. These have been quite limited as to the type of signal processing and enhancement operations that could be performed by the characteristic type of apparatus that resulted from following that approach.

More sophisticated signal processing is possible by means of the direct application of techniques for filtering 2-D data, known from the field of Mathematical Image Processing Theory. Various techniques for the enhancement of digital images are usually implemented by programming a general purpose computer to operate on stored digitized images off-line. These 2-D filtering techniques can be implemented in real-time by means of dedicated hardware. See for example, "High-Speed Architectures for Digital Image Processing", by A. N. Venetsanopoulos, K. M. Ty, and A. C. P. Loui, IEEE Trans. on Circuits and Systems, Vol. CAS-34., No. 8, 887–895, August 1987.

Due to hardware constraints, conventional designs of dedicated 2-D filters have favoured FIR filters even though IIR (Infinite Impulse Response) filters are known to be more efficient allowing lower order realizations than their FIR counterparts.

Considerations of hardware complexity, physical size of apparatus, power consumption, and economical manufacture are all of vital importance in any practical signal processing apparatus intended for use in consumer products.

The present invention introduces a dedicated hardware apparatus for real-time 2-D filtering which is based on a semi-systolic analog structure realization. The hardware realization is based directly on the 2-D digital transfer function H($z_1,z_2$) and utilizes off-the-shelf components. Both FIR and the more efficient IIR filtering structures can be realized with this approach and high real-time rates can be attained through the use of analog components that have inherently small delay times. Also since the structures are semi-systolic they have advantages for VLSI implementation such as modularity, regularity, and high parallelism.

Recently, motion adaptive digital filters have been proposed for use in high-definition television video signal processing. These can be regarded as common 3-D FIR filters, for the implementation of techniques for video signal processing. They require delays of one or more field periods, such delays being accomplished by means of frame-stores. Since pixels in separate fields are combined, this type of signal processing is referred to as temporal filtering and can only be performed on those pixels for which no motion in the scene of the picture being displayed has occurred between fields. Thus the development of such a filter is complicated by the necessary inclusion of circuitry that implements a motion detection algorithm. The embodiments of apparatus arising out of the present invention do not require analog to digital (A/D) and digital to analog (D/A) converters, often used in conjunction with analog pre-filters and post-filters, to convert video signal data from analog raster scanned form to sampled digital data for processing; nor do they require expensive frame-stores or motion detection circuitry.

Other methods of performing real-time 2-D signal processing have been based on elaborate algorithms such as the Burt Pyramid which separates an image into a number of 2-D spatial frequency bandpass images. See for example, "A Two-Dimensional Real-Time Video Pyramid Processor", by J. H. Arbeiter and R. F. Bessler, RCA Review, Vol. 47, 3–31, March 1986. This method, although capable of real-time operation, has the disadvantage of greater complexity relative to the present invention, due to the need to process multiple bands and to generate a set of component images. When embodied in digital hardware, a large amount of circuitry is required along with the need for A/D, and D/A converters.

Theoretical aspects of the present invention have been described in "Realization of 2-D IIR Filters using Sample-and-Hold Circuitry", by M. A. Sid-Ahmed, 1991 IEEE International Symposium on Circuits and Systems, Vol. 5, June 1991, pp. 2467–2470.

This application encompasses both theoretical as well as actual hardware implementation which is the combined work of both applicants.

SUMMARY OF THE INVENTION

The object of the present invention is to provide an apparatus for two-dimensionally filtering (i.e. signal processing) an image at high real-time rates such as those required for HDTV, with either IIR or FIR structures, without the need for expensive digital systems that require A/D and D/A converters. The wide variety of 2-D signal processing techniques (e.g. high pass filtering) that are based on a 2-D transfer function of general order can be implemented.

The use of a semi-systolic structure allows a number of advantages for VLSI implementation such as modularity, regularity and high parallelism. The apparatus of the present invention also has advantages in view of considerations of hardware complexity, physical size of apparatus, power consumption and economical manufacture. Use of analog components in the processing elements of the apparatus makes high-speed operation for real-time applications in HDTV possible.

DETAILED DESCRIPTION

Figure 1:
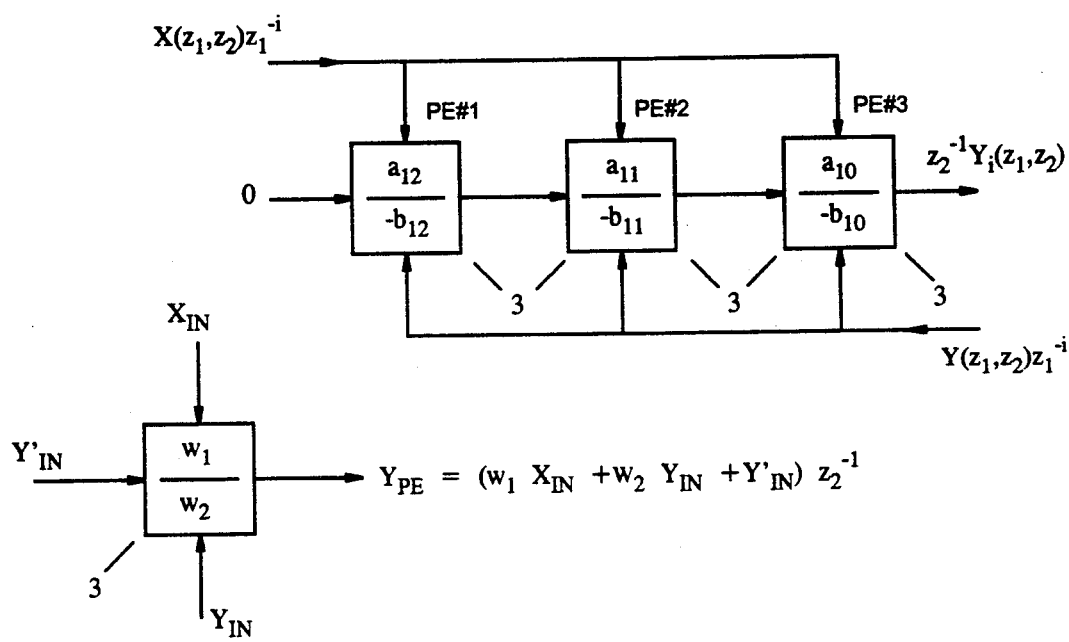
FIG. 1 is a block diagram showing the partial realization of a 2×2 IIR embodiment of the invention.

In general, a two-dimensional (abbreviated as 2-D) image can be described as a function of two independent spatial variables and time in the scene f(x,y,t). However, the time variable t is constant over a given image frame so for our purposes f(x,y,t) reduces to f(x,y). The image is converted to an electrical time varying signal for transmission by the process of periodic horizontal scanning. The resulting signal is often referred to as a raster scanned image. Interlacing is often introduced in TV signals to lower the video bandwidth requirements while simultaneously increasing the effective frame rate. In interlacing the even lines are scanned first, then all the odd lines, producing two alternate fields of lines for each picture frame.

In describing the present invention, we consider each field of the picture, whether interlaced or not, to be a separate image. A raster scanned image is interpreted as a 2-D input signal, consisting of individual horizontally scanned lines occurring in discrete time periods, each line being a continuous electrical time varying signal.

The input signal may optionally be sampled within each line by applying it to a sample-and hold device, so that each line is divided into a number of sampling periods (T) or pixels, yielding a time sampled analog signal. In the discussion that follows the terms sampling period, pixel, and pixel time are used interchangeably In general a 2-D recursive (IIR) digital filter transfer function is given by:

$$H(z_1, z_2) = \frac{Y(z_1, z_2)}{X(z_1, z_2)} = \frac{\sum_{i=0}^{M}\sum_{j=0}^{N} a_{ij} z_1^{-i} z_2^{-j}}{\sum_{i=0}^{M}\sum_{j=0}^{N} b_{ij} z_1^{-i} z_2^{-j}} \quad (1)$$

where M×N is the order of the filter and $\{a_{ij}\}$ and $\{b_{ij}\}$ are the filter coefficients and are determined from a design procedure wherein stability and specifications are considered. (Usually $b_{00}=1$ in the above equation.)

In the time domain, $z_2^{-1}$ corresponds to a time delay of one pixel time, while $z_1^{-1}$ corresponds to a row delay which in the case of a raster scanned image is a delay of one line scanning period. Note that whether or not an optional sample-and-hold device is used, the input signal may be thought of conceptually as being divided into a number of pixels.

Note that an FIR (finite impulse response) filter results when all of the $b_{ij}=0$ (except for $b_{00}=1$), and an IIR filter results otherwise. A non-recursive (FIR) filter will always be stable.

Corresponding to equation (1) in the time domain is the so-called recursive equation which relates the output sample of the filter y(m,n) to the input sample x(m,n) occurring at the same point in time.

$$y(m, n) = \sum_{i=0}^{M}\sum_{j=0}^{N} a_{ij} x(m-i, n-j) - \quad (2)$$

$$\sum_{\substack{i=0\ j=0 \\ i+j \neq 0}}^{M}\sum^{N} b_{ij} y(m-i, n-j)$$

where again M×N is the order of the filter and $\{\{a_{ij}\}, \{b_{ij}\}\}$ is the set of design coefficients. We have made the assumption of a casual system in equations (1) and (2) so that the output signal y(m,n) is written as a function of the input signal x(m,n) and past values of the input signal and output signal, x(m,n), y(m,n) respectively.

We can write equation (2) in the z-domain as $$Y(z_1, z_2) = \sum_{i=0}^{M}\sum_{j=0}^{N} a_{ij} X(z_1, z_2) z_1^{-i} z_2^{-j} - \quad (3)$$

$$\sum_{\substack{i=0\ j=0 \\ i+j \neq 0}}^{M}\sum^{N} b_{ij} Y(z_1, z_2) z_1^{-i} z_2^{-j}$$

Multiplying by $z_2^{-1}$ (thus introducing one pixel of latency in the output) and re-arranging yields $$z_2^{-1} Y(z_1, z_2) = \sum_{i=0}^{M} z_2^{-1} Y_i(z_1, z_2) \quad (4)$$

where $$z_2^{-1} Y_0(z_1, z_2) = z_2^{-1} \{a_{00} X(z_1, z_2) \quad (5)$$

$$+ z_2^{-1} ([a_{01} X(z_1, z_2) - b_{01} Y(z_1, z_2)]$$

$$+ z_2^{-1} ([a_{02} X(z_1, z_2) - b_{02} Y(z_1, z_2)]$$

$$+ z_2^{-1} ( \ldots$$

$$+ z_2^{-1} ([a_{0j} X(z_1, z_2) - b_{0j} Y(z_1, z_2)]$$

$$+ z_2^{-1} ( \ldots$$

$$+ z_2^{-1} ([a_{0N} X(z_1, z_2) - b_{0N} Y(z_1, z_2)] \ldots )\}$$

and

-continued $$z_2^{-1}Y_i(z_1, z_2) = z_2^{-1}\{[a_{i0}X(z_1, z_2)z_1^{-i} - b_{i0}Y(z_1, z_2)z_1^{-i}] \quad (6)$$
$$+ z_2^{-1}([a_{i1}X(z_1, z_2)z_1^{-i} - b_{i1}Y(z_1, z_2)z_1^{-i}]$$
$$+ z_2^{-1}([a_{i2}X(z_1, z_2)z_1^{-i} - b_{i2}Y(z_1, z_2)z_1^{-i}]$$
$$+ z_2^{-1}(\ldots$$
$$+ z_2^{-1}([a_{ij}X(z_1, z_2)z_1^{-i} - b_{ij}Y(z_1, z_2)z_1^{-i}]$$
$$+ z_2^{-1}(\ldots$$
$$+ z_2^{-1}([a_{iN}X(z_1, z_2)z_1^{-i} - b_{iN}Y(z_1, z_2)z_1^{-i}] \ldots )\}$$

for $i = 1, \ldots, M$.

The realization of the partial result $z_2^{-1}Y_i(z_1, z_2)$ in terms of processing elements (PE's) 3, based on equation (6), is shown in FIG. 1. Shown below in FIG. 1 is the general block diagram symbol for a processing element with the input-output relationship $Y_{PE} = (w_1 X_{IN} + w_2 Y_{IN} + Y'_{IN})z_2^{-1}$ indicated.

Figure 2:
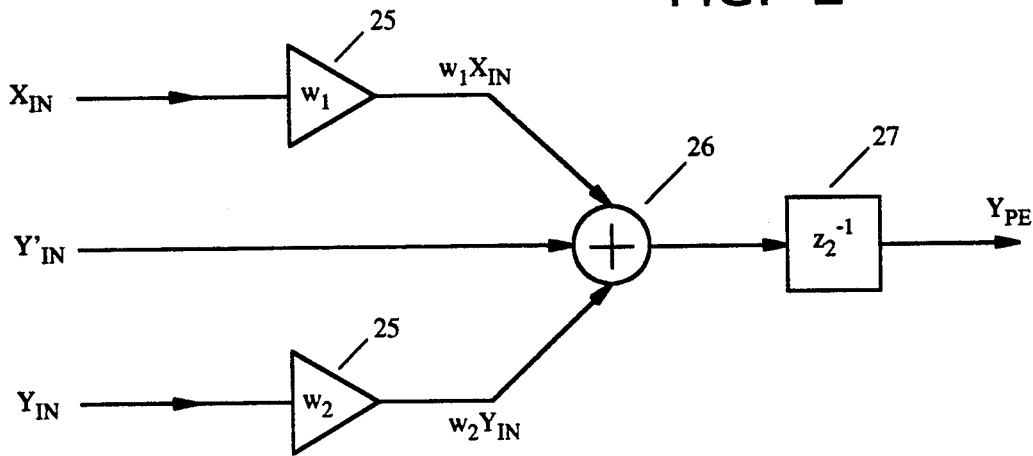
FIG. 2 is a block diagram of a processing element (PE)

In FIG. 2, the internal structure of the general processing element is shown. Each PE consists of two coefficient multipliers 25, an adder 26, and a pixel delay 27, connected as shown. Note that $w_1$ and $w_2$ correspond to some specific filter design coefficients in the set $\{\{a_{ij}\},\{b_{ij}\}\}$ that are required in a particular PE.

Figure 3:
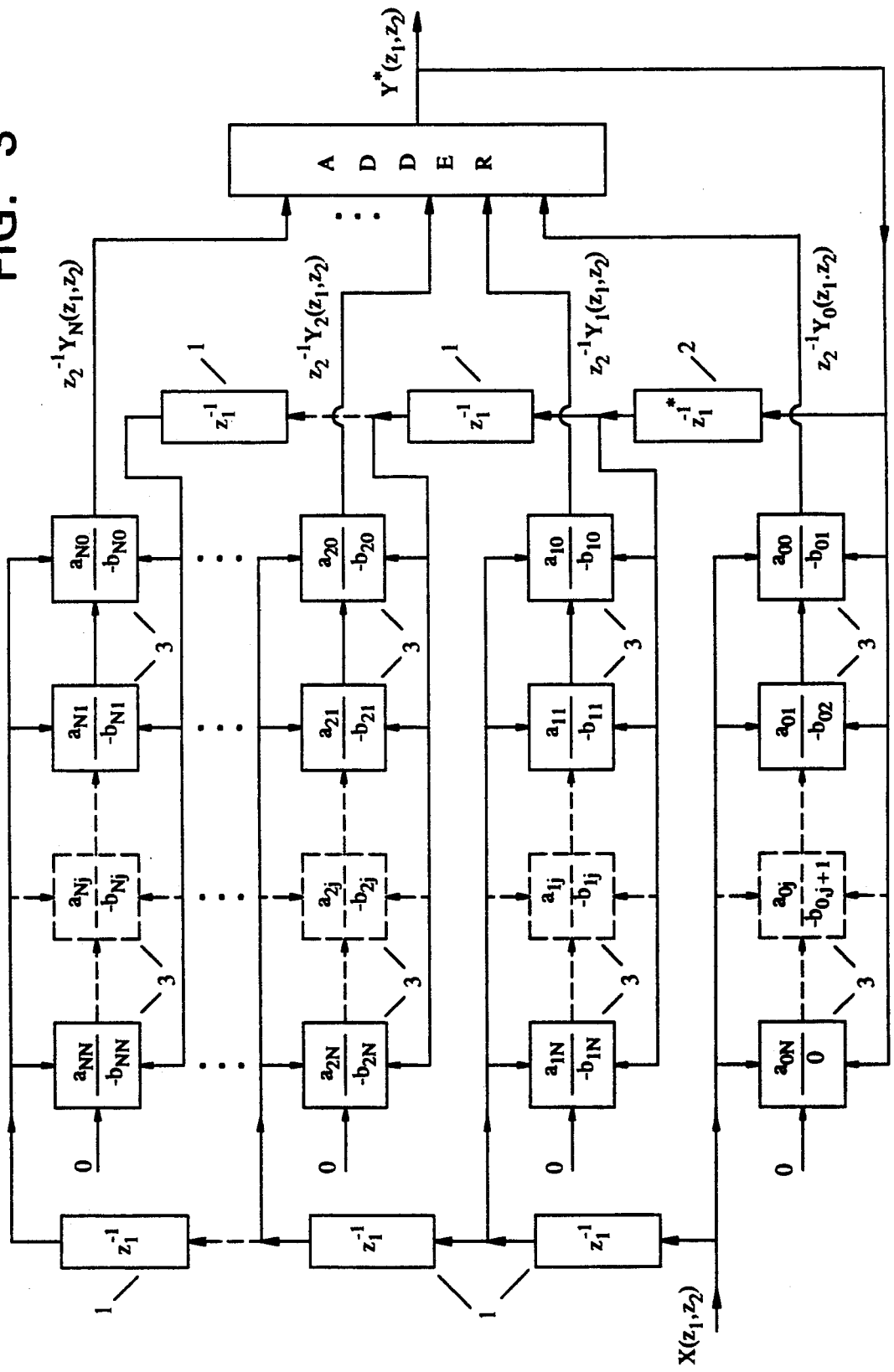
FIG. 3 is a block diagram of the form of the semi-systolic signal processing apparatus for the general case of an M×N IIR structure.

The overall 2-D semi-systolic filter structure based on equations (4), (5) and (6) is realized as shown in FIG. 3. There the following should be noted. Firstly, the output signal of the structure $Y^*(z_1,z_2)$ has been denoted with an asterisk because the output signal is produced with a latency of one pixel time and is actually $z_2^{-1}Y(z_1,z_2)$, which corresponds to $y(m,n-1)$ in the time domain rather than $y(m,n)$. To remove the effects of this latency on the feedback, the first line delay 2, in the feedback path must, in practice, be shortened by one pixel time and is thus denoted $z_1^{-1*}$. Also, because a latent (by one pixel time) signal is fed back to the lowermost bank of PE's, the "b" coefficients occur in the order $0, \ldots, b_{0j}, \ldots, -b_{01}$ from left to right, in that bank of PE's (as shown in FIG. 3). In FIG. 3, $z_1^{-1}$ is used to represent a row delay 1, which in the case of a raster scanned image is a delay of one line scanning period (63.5 μs in the NTSC television standard presently in use in the United States).

The invention will now be further illustrated by discussing a preferred embodiment of a 2×2 IIR filter structure. Taking $M = N = 2$ in FIG. 3, we obtain the structure of FIG. 4 which shows the overall signal processing structure in block diagram form as composed of signal delay lines 1, 2, and processing element blocks 3. The signal delay lines 1, impart a delay of one horizontal line scanning period. A horizontal line scanning period is often denoted as 1H and corresponds to 63.5 μs in the NTSC system. The signal delay line 2, differs from those denoted 1, in the figure, only in that the time delay imparted is one pixel time less than one horizontal line scanning period (i.e. 1H-T where T is the pixel time). Partial results $z_2^{-1}Y_0(z_1,z_2)$, $z_2^{-1}Y_1(z_1,z_2)$ and $z_2^{-1}Y_2(z_1,z_2)$ are added by an operational amplifier summing circuit to produce the output $Y^*(z_1,z_2)$.

Figure 5:
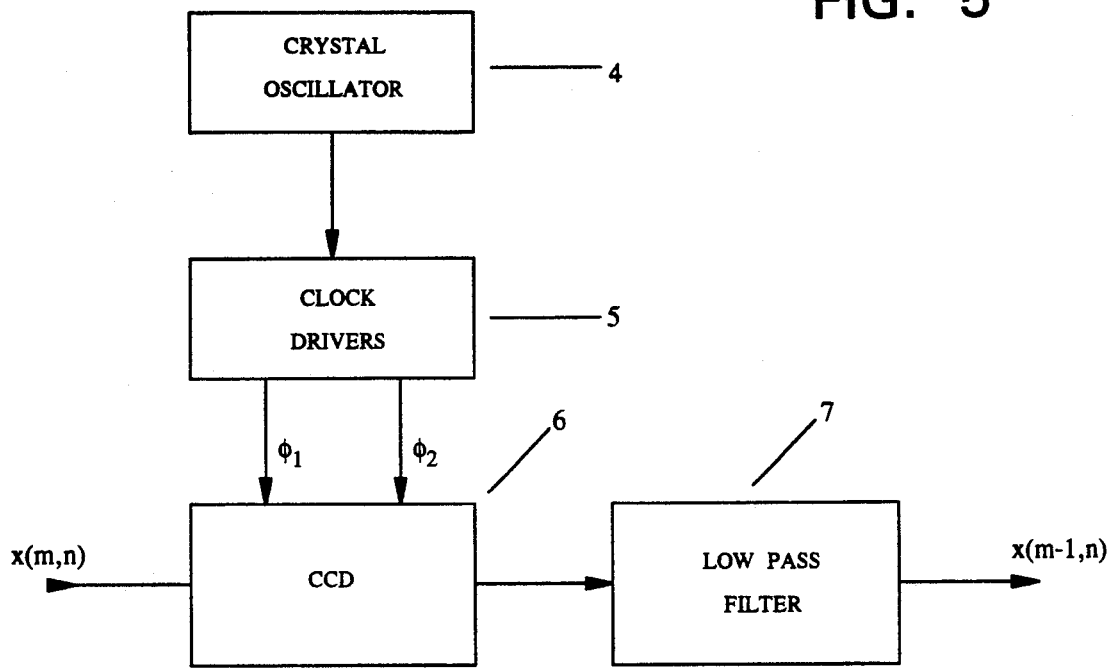
FIG. 5 is a block diagram of a CCD 1H delay line.
Figure 5B:
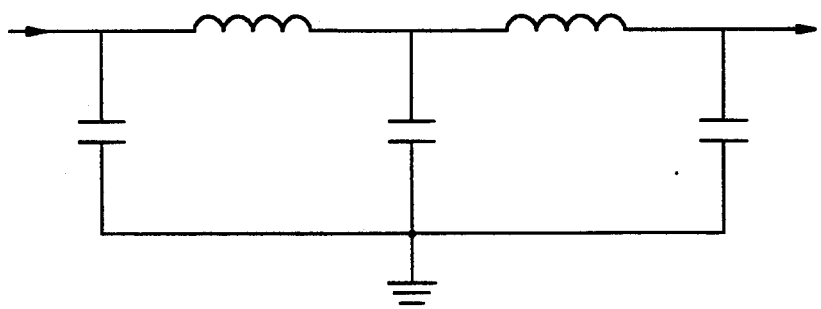
FIG. 5B is a circuit diagram of the low pass filter circuit which was represented as a circuit block in the block diagram of FIG. 5.

The signal delay lines are typically charge transfer devices (CCD's) and are operative to delay signals in the baseband or video frequency range (e.g. 0 to the vicinity of 5 MHz). Such devices are commercially available, an example being the Fairchild-Weston CCD321, fabricated in the buried-channel NMOS process. FIG. 5 shows a CCD 1H delay line. The clock system oscillator 4 is typically a crystal controlled oscillator, and is available commercially from many sources. Alternatively, if the system is to operate in a color television receiver, the clock system oscillator signal may be generated by supplying the color subcarrier oscillator (typically 3.58 MHz) to a frequency multiplier circuit to obtain a 14.31818 Mhz clock signal as would be required for a CCD with 910 stages, to obtain a delay of one horizontal line scanning period (1H). The clock signal from oscillator 4, is supplied to clock driver circuitry 5. The type of clock driver circuits used will be a function of the type of charge coupled device being used 6. These circuits will typically be TTL or CMOS family integrated circuit devices arranged to provide a system of two-phase clock signals, $\phi_1$ and $\phi_2$, which are oppositely phased, 50% duty cycle, relatively square waves. These clock signals are suitable for effecting transfer of charge between stages of a charge transfer device type of delay line. In the Fairchild-Weston CCD321, which has a charge injection port at its input and a sample-and-hold circuit in its output amplifier, the two-phase system of clocks $\phi_1$ and $\phi_2$ is applied to the device to effect charge injection at the input as well as interstage charge transport and clocking of the sample-and-hold circuit in the output amplifier. (A sample-and-hold device in the output stage of a CCD is not essential to the operation of the present invention but offers the advantage of reducing the clock frequency components in the signals). The output signal from the CCD is a line delayed version of the input signal, which may contain components of the sampling clock frequencies and its harmonic frequencies. These undesirable frequency components in the output can be suppressed by a suitable low pass filter circuit 7. A passive low pass filter suitable for this purpose based on an arrangement of inductors and capacitors is shown in FIG. 5B. A gain stage can be used in conjunction with such a passive low pass filter to compensate for losses.

A more complex system of clock driver (logic) circuits for charge-coupled devices which has the advantage of reducing noise is described in U.S. Pat. No. 4,158,181, Jun. 12, 1979, by Balopole.

The delay element has been described in a typical embodiment based on the use of a CCD, however, other conventional devices are well-known for being able to produce a delay of 1H. Such devices include those that are based on acoustic-wave propagation such as glass block devices.

Figure 4:
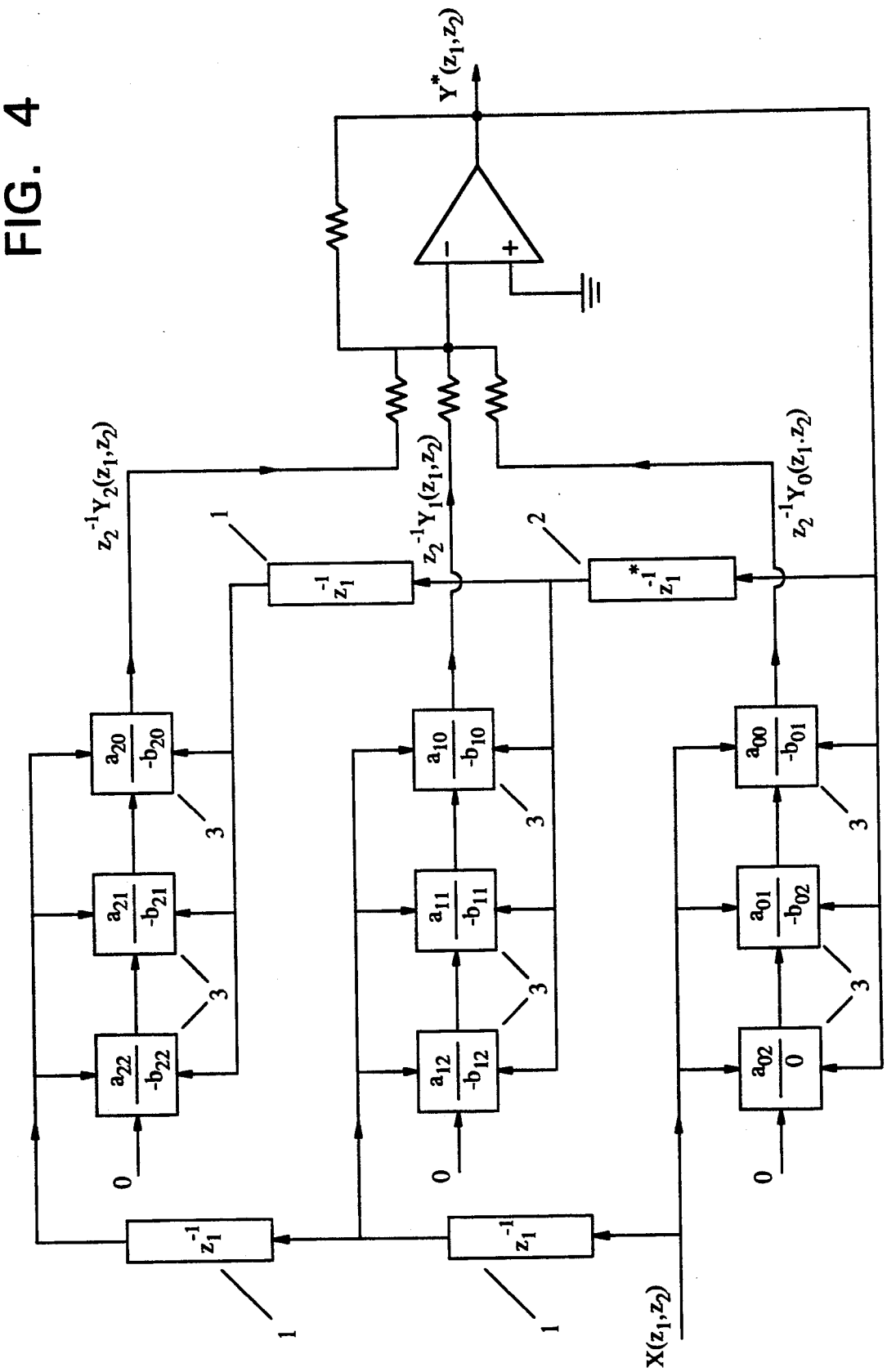
FIG. 4 is a block diagram of the form of the 2-D semi-systolic signal processing apparatus for the specific case of a 2×2 IIR structure.
Figure 6:
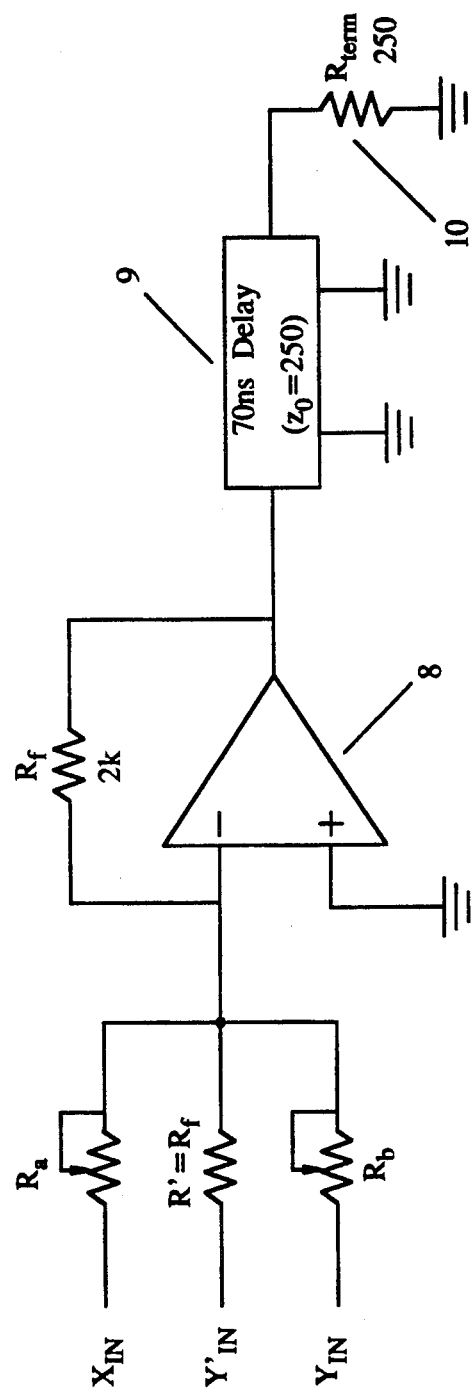
FIG. 6 shows a practical circuit for a preferred embodiment of a processing element (PE).

All of the processing elements (PE's) 3, in the preferred embodiment of FIG. 4 are identical. A possible embodiment of a PE is shown in FIG. 6. The op-amp 8 is configured as an inverting summer. Resistors $R_a$ and $R_b$ are variable while resistors $R'$ and $R_f$ are fixed such that $R' = R_f$. The output of the op amp will produce the sum $(-R_f/R_a)X_{IN} + (-R_f/R_a)Y_{IN} + (-Y'_{IN})$ Comparing with the block diagram model of the PE shown in FIG. 2, $w_1 = (-R_f/R_a)$ and $w_2 = (-R_f/R_b)$. The op-amp 8, should be a wide-band type operational amplifier suitable for the video baseband signal range being processed. Power bandwidth and slew-rate and settling time specifications must also be adequate for proper operation. The settling time specification should be sufficiently small as to allow for rapid settling within the pixel time of the signal being processed. Typical devices for NTSC application are the LM318, and the EL2020C (Elantec). The EL2020C is a high-speed Monolithic (50 MHz) current feedback type op-amp, specifically designed for video and other applications that require high slew rates, fast settling times and low power consumption. Higher performance (200 MHz) current feedback op-amps specifically designed for HDTV and other comparable high-speed applications such as the EL400 (Elantec) are available in an 8 pin mini-DIP package that is pinout compatible with the EL2020C.

Figure 7:
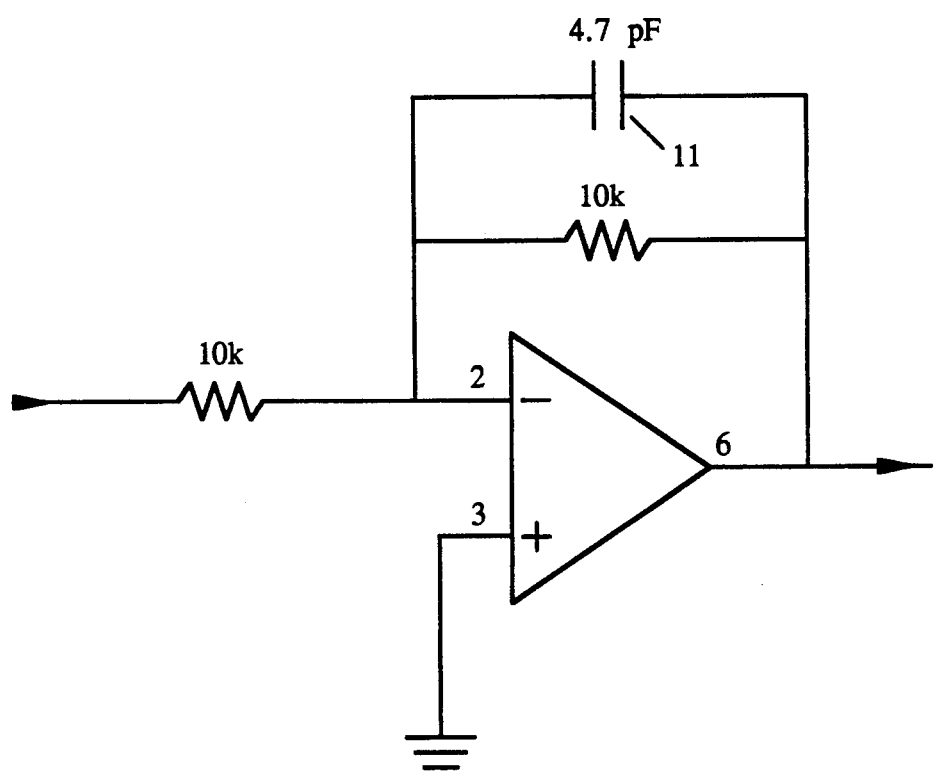
FIG. 7 is a circuit diagram of a typical signal inverter.

Note that $w_1$ and $w_2$ referred to above correspond to some specific filter design coefficients in the set $\{\{a_{ij}\}, \{b_{ij}\}\}$ that are required in a particular PE. In general these coefficients may be either positive or negative and the inversion introduced by the op-amp summing circuit must be taken into account. Signals $X_{IN}$, $Y_{IN}$, and $Y'_{IN}$ in FIG. 6 should be assigned the appropriate algebraic sign so as to correctly satisfy equations (4), (5), and (6) for the overall structure. Sign change of a signal may be accomplished, wherever required, by means of an inverter circuit. Inverter circuitry may be based on op-amps as shown in FIG. 7. A 4.7 pF capacitor 11, is required in the feedback loop to prevent oscillations in the output when a wideband amplifier such as the LM318 is used.

In the embodiment being described, a passive delay line 9, (in FIG. 6), is used to implement a pixel delay (denoted $z_2^{-1}$ in the z-domain). In the time domain, a signal $x(m,n)$ is delayed by one pixel time resulting in a delayed version of the signal $x(m,n-1)$. A typical passive delay line device is the type 1514-70D (Data Delay Devices). Lumped constant delay lines of this type are widely used in a number of electronic applications. For instance, in color TV receivers the luminance signal is delayed to synchronize it with the chrominance signal. The type 1514-70D delay line has a delay time $T_d = 70$ ns and a characteristic impedance $z_0 = 250\Omega$. Accordingly the delay is terminated in a matching (in this case 250 $\Omega$) resistor 10. This type of delay line is available in a four pin SIP package that does not take up much circuit board space. Lumped constant delay lines with a clock input and sample-and-hold output are available in eight pin DIP packages (e.g. Reticon 5100 series) and are also suited to the embodiment being described.

Figure 8A:
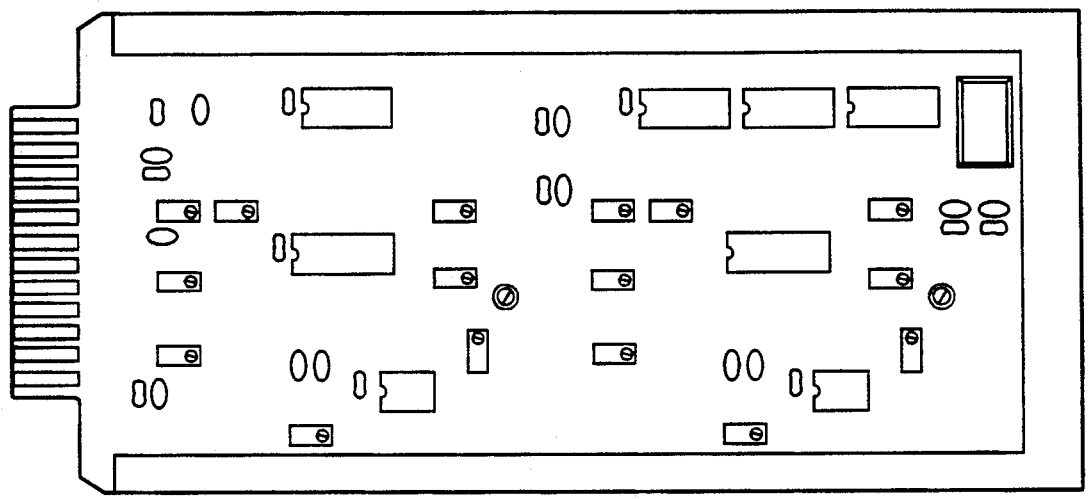
FIG. 8A is a photograph showing two circuit boards, each board containing two line delays, used in a constructed prototype of a preferred embodiment of a 2×2 IIR filter apparatus.
Figure 8A:
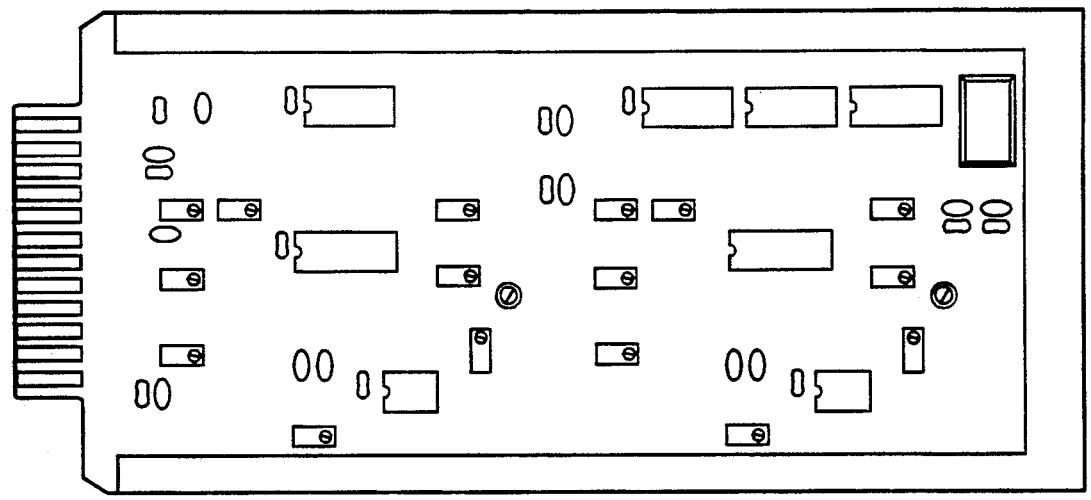
Figure 8B:
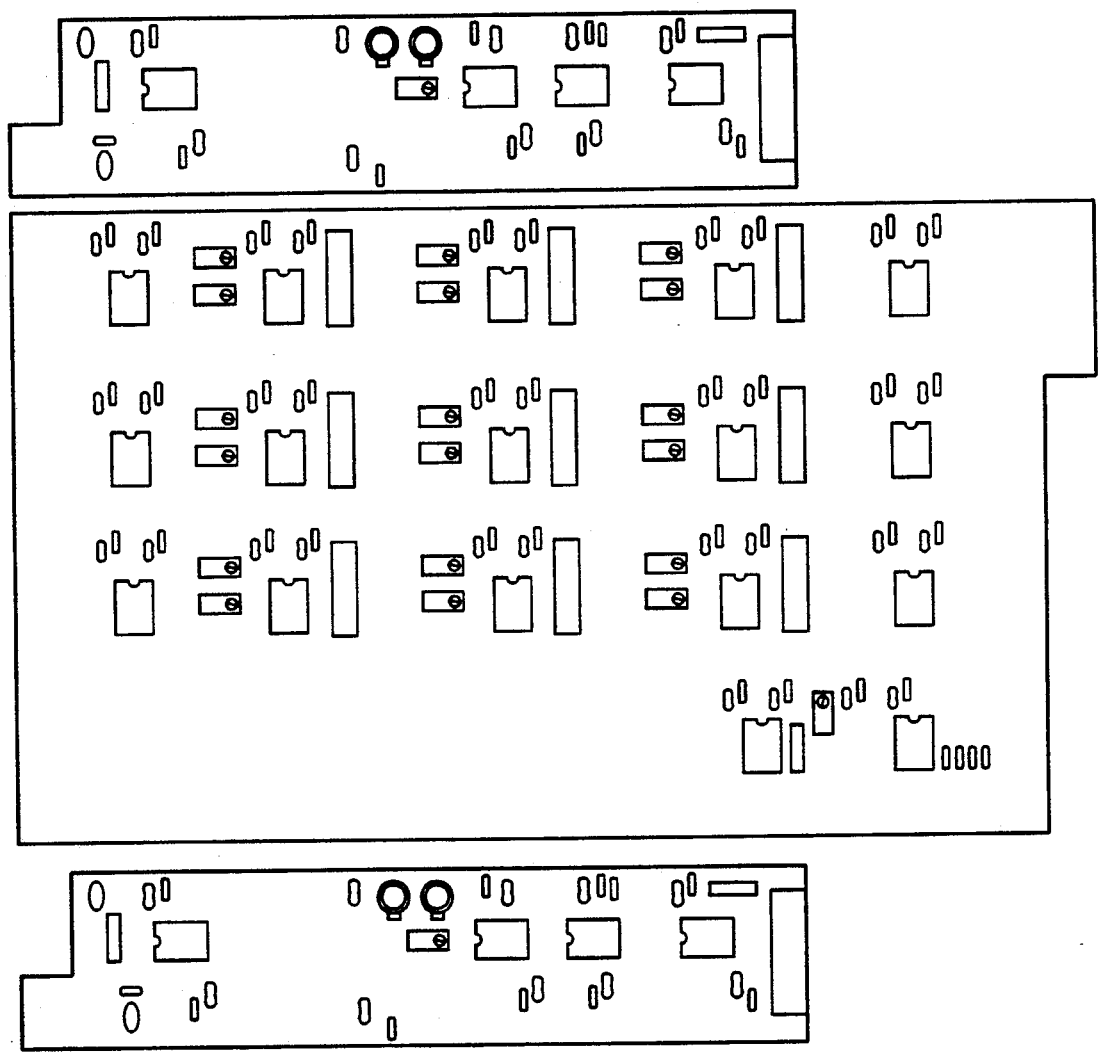
FIG. 8B is a photograph showing a circuit board containing the circuitry, excluding line delays, of a constructed prototype of a preferred embodiment of a 2×2 IIR filter apparatus.

Photographs of a constructed prototype of a preferred embodiment of a 2×2 IIR filter apparatus such as has just been described are shown in FIGS. 8A and 8B. The filter circuitry without line delays is shown in FIG. 8B while FIG. 8A shows two circuit boards, each board containing two line delays of the filter.

Figure 9:
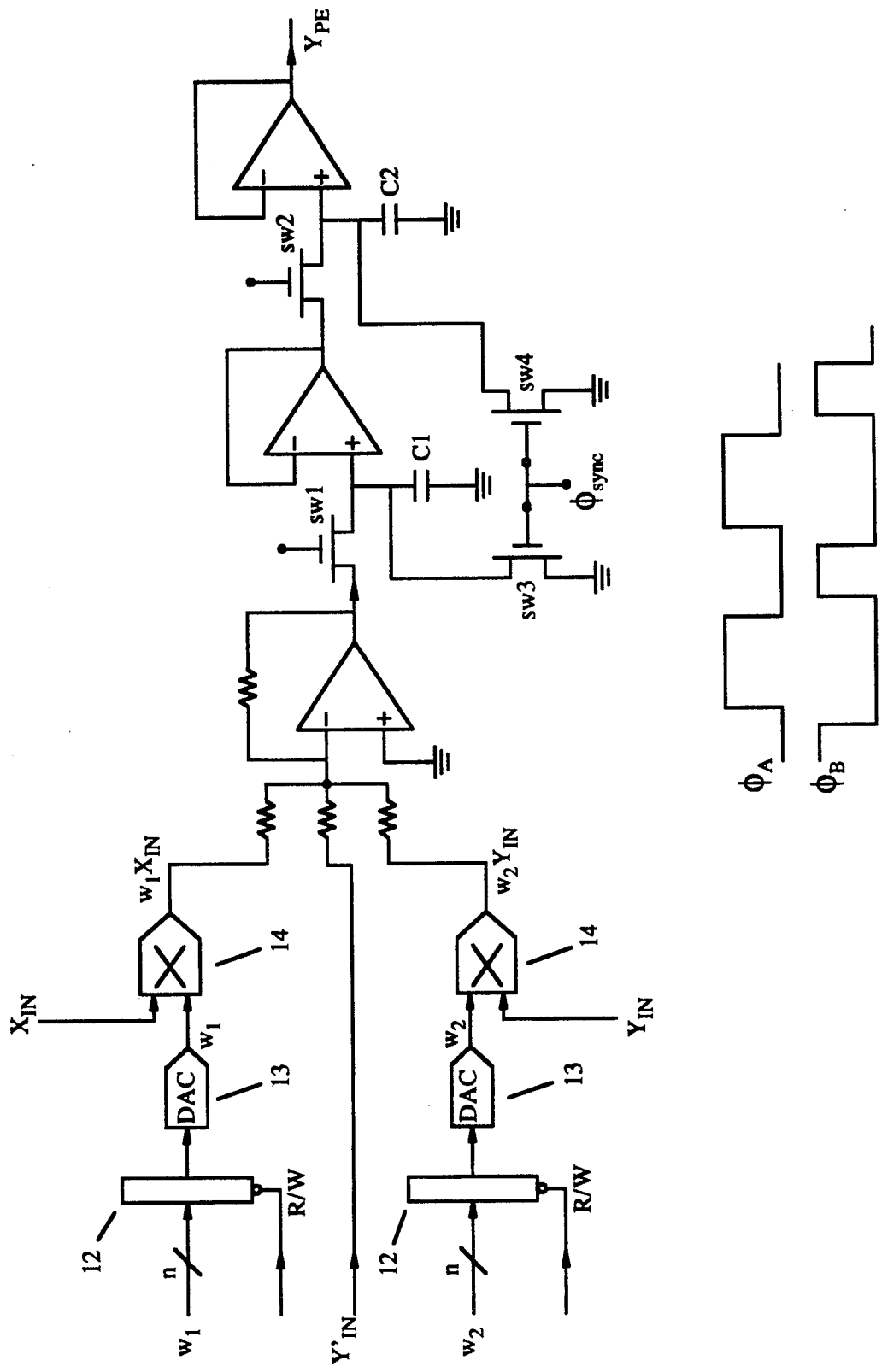
FIG. 9 shows a practical circuit for a preferred embodiment of a processing element (PE), in which the filter coefficients, which are the local variables of the PE, are digitally programmable.

There are alternative methods of realizing the processing element whose block diagram is shown in FIG. 2. We will now consider the processing element as embodied in FIG. 9, in which the coefficient values are digitally programmable and in which the pixel delay is implemented as a cascade of two sample-and-hold circuits. With reference to FIG. 9, it consists of two n-bit registers 12, for storing the filter coefficients, digital-to-analog converters 13, to convert the digital coefficient values $w_1$ and $w_2$, into analog form and analog multipliers 14, which produce the products $w_1 X_{IN}$ and $w_2 Y_{IN}$. These two products together with $Y'_{IN}$ are summed by an inverting operational amplifier summer to obtain the direct sum $(-w_1 X_{IN}) + (-w_2 Y_{IN}) + (-Y'_{IN})$. The signal represented by this sum is then delayed by one pixel time. In the circuitry shown in FIG. 9 this signal delay is accomplished as follows: The signal voltage is stored on capacitor C1 when sw1 closes during the high level of the clock waveform $\phi_A$. During the high level of $\phi_B$, sw2 closes and transfers the signal voltage that was stored on C1 to C2. During flyback, i.e. the transition form one line scan period to the next, the horizontal sync. pulse $\phi_{SYNC}$ is used to close the two analog switches sw3 and sw4 to discharge capacitors C1 and C2, if it is desired to set zero initial conditions at the output of the processing element at the beginning of each line scan period.

Figure 10:
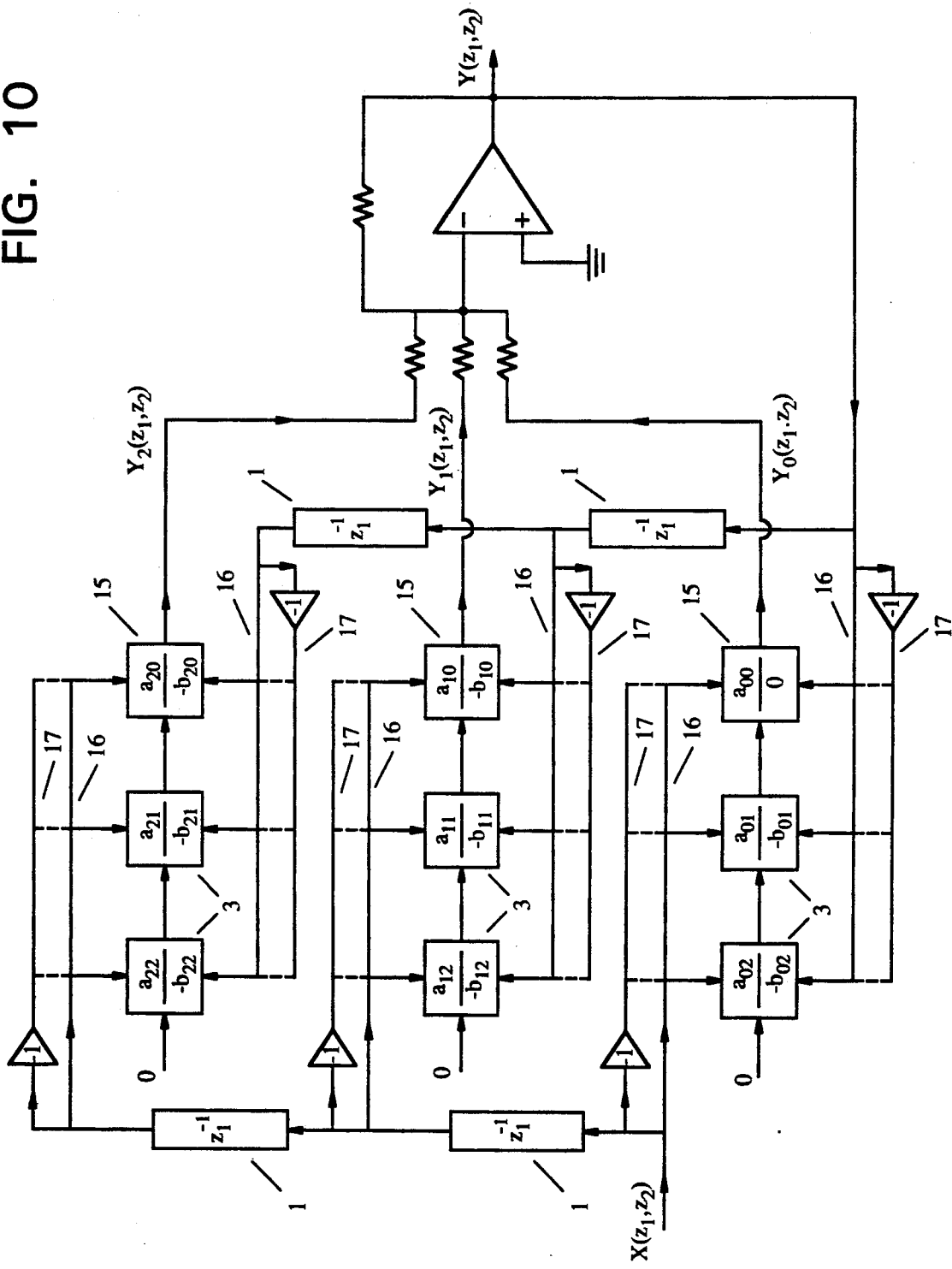
FIG. 10 shows how the signal processing apparatus shown in the block diagram of FIG. 4 can be modified through the use of two types of processing element (PE) to allow the use of line delays which are all of standard length 1H.

The invention, as described so far, requires line delays of different lengths. For example, in FIG. 4, there are line delays 1, which impart a delay of 1H (one line scan period) while the line delay 2, imparts a delay which is one pixel time less than 1H. The need for a non-standard length line delay may make implementation impractical. In FIG. 10 we illustrate how this situation can be remedied within the present invention. FIG. 10 is similar to FIG. 4 in that the case $M = N = 2$ is depicted. However in FIG. 10 all line delays 1, are of standard length 1H, while the PE's are of two differing types which will be referred to as type I and type II. Type I PE's 3, are used everywhere except at the end of each bank of PE's, where a type II PE 15, is used instead. A type I PE has the structure given in FIG. 2 and may be embodied in practical hardware as suggested in FIG. 6. Thus type I PE's are the same as those that we have been describing until now.

Figure 11:
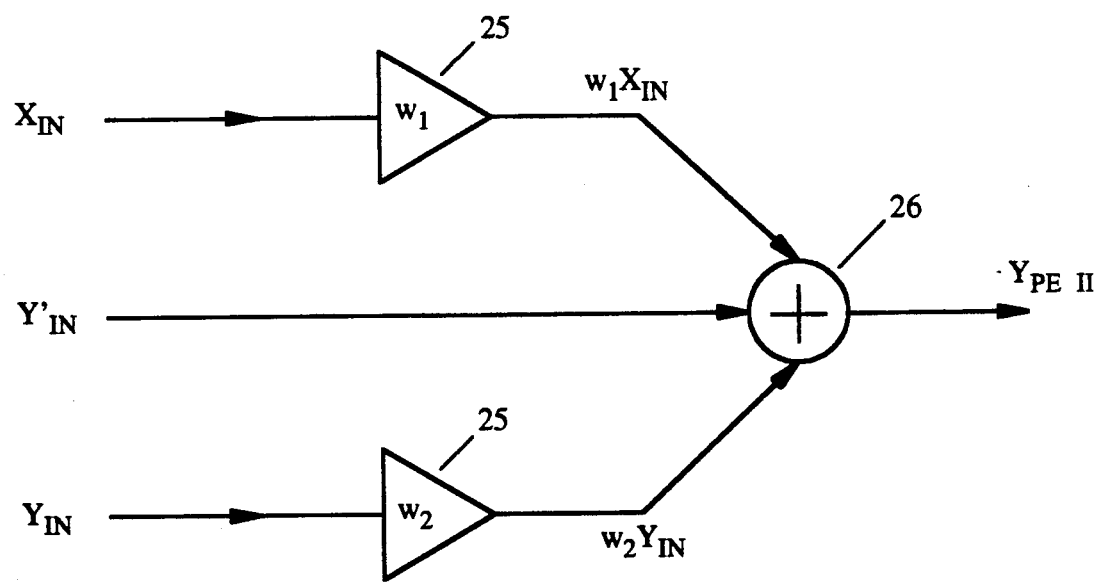
FIG. 11 is a block diagram of a type II processing element (PE) as would be used to implement the invention as depicted in FIG. 10.

A type II PE has the structure given in FIG. 11, from which it is seen that a type II PE is simply a type I PE without a pixel delay stage (often denoted $z_2^{-1}$). Accordingly a type II PE may be embodied in practical hardware in the same way as a type I PE, but with the components for producing a pixel delay being excluded.

Another change, shown in FIG. 10, which may be made for greater ease of construction with off-the-shelf components, is the introduction of dual broadcast lines, allowing either non-inverted or inverted data to be sent to each PE. (Note that lines through which PE's receive the same data in parallel are called broadcast lines.) In FIG. 10 each of these dual broadcast lines is depicted as having a non-inverted data line 16, and a data line 17 on which the data is inverted in sign.

The local variables of the PE's are the filter coefficients, that is, the set of numbers $\{\{a_{ij}\}, \{b_{ij}\}\}$, in equation (1) that are chosen to approximate the desired filter response. The use of dual broadcast lines provides a convenient method for assigning the correct sign to the data reaching each PE, assuming that local variables are set within each PE without regard to sign.

Figure 12:
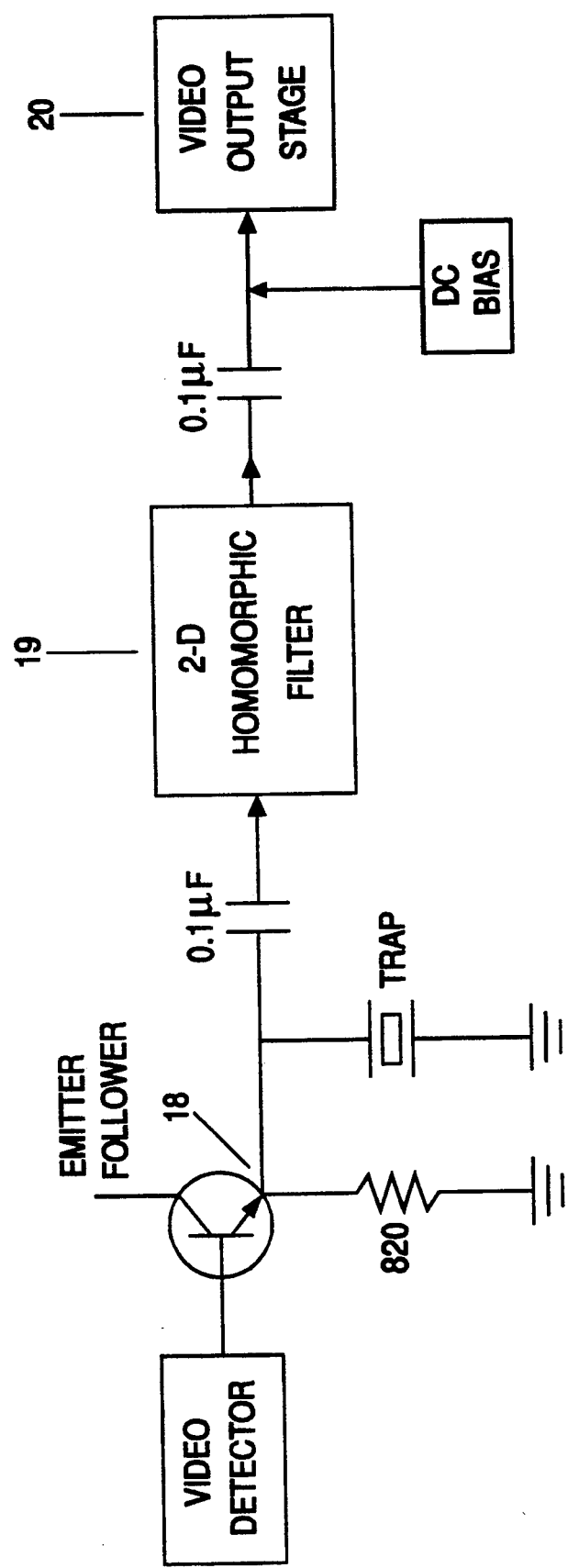
FIG. 12 is a block diagram showing how the 2-D semi-systolic signal processing apparatus is typically inserted into television video circuitry.

Many applications of the characteristic type of apparatus that result from the method of the present invention are possible. These applications include television raster scanned imaging systems in a diversity of areas, including those of broadcast television, industrial video, and biomedical video. FIG. 12 depicts a simple application in which 2-D signal processing apparatus of the type arising out of the present invention is inserted into the video circuitry of a black and white television receiver. With reference to FIG. 12, the detected video signal available at the emitter follower 18, at approximately a one volt peak to peak level, is supplied (typically AC coupled as shown) to the input of the 2-D signal processing apparatus 19, which implements a given filtering technique. The filtered signal is in turn sent to the final video output stage 20.

The foregoing descriptions of preferred embodiments of the present invention have been presented for the purposes of illustration and description. They are not intended to be exhaustive or to limit the invention to the precise forms disclosed. Many modifications and variations are possible in light of the above teaching. Moreover, it should not be construed that the present invention is limited to those applications which involve raster scanned images in the context of a particular standard, which is either existing or envisioned (i.e. NTSC, PAL, etc.).

What is claimed is:

1. A signal processing apparatus for two-dimensionally filtering an analog baseband video signal having a raster scanned format, that is, said video signal is one being constituted by a plurality of line signals each having a pre-determined line period, said apparatus comprising:

a two-dimensional filter having a transfer function $H(z_1,z_2)$ given by $$H(z_1, z_2) = \frac{Y(z_1, z_2)}{X(z_1, z_2)} = \frac{\sum_{i=0}^{M}\sum_{j=0}^{N} a_{ij}X(z_1, z_2)z_1^{-i}z_2^{-j}}{\sum_{i=0}^{M}\sum_{j=0}^{N} b_{ij}Y(z_1, z_2)z_1^{-i}z_2^{-j}}$$

wherein $\{a_{ij}\}$ and $\{b_{ij}\}$ are the filter coefficients chosen to select the desired two-dimensional frequency response in regards to magnitude and phase, M and N are integers greater than zero, denoting limits of summation corresponding to the order of the filter, $z_1$ and $z_2$ are the standard z-plane variables, $X(z_1,z_2)$ is the input signal to said two-dimensional filter and $Y(z_1,z_2)$ is the output signal of said two-dimensional filter;

said two-dimensional filter comprising:

at least one line delay means (1H) imparting a delay equal to substantially one horizontal line scanning period of said raster scanned signal;

one line delay means (1H−T) imparting a delay equal to substantially one time period T less than one horizontal line scanning period of said raster scanned signal;

one adding means for generating the output $Y(z_1,z_2)$ as a sum of M partial results;

a plurality of signal processing modules called processing elements each processing element being comprised of:

first input signal line denoted $X_{IN}$, second input signal line denoted $Y_{IN}$, third input signal line denoted $Y'_{IN}$, which receives either the output signal of another processing element or the zero signal;

first multiplier means for multiplying the first input signal by a first coefficient ($a_{ij}$), second multiplier means for multiplying the second input signal by a second coefficient ($b_{ij}$), adding means for adding together the output signals of said first and second multiplier means and said third input signal line, delay means for delaying the output signal of said adding means by a time period T;

wherein, said at least one line delay means (1H), said one line delay means (1H−T), said one adding means for generating the output $Y(z_1,z_2)$ as a sum of M partial results, and said plurality of processing elements are interconnected to implement said transfer function of said two-dimensional filter.

2. A signal processing apparatus for two-dimensionally filtering an analog baseband video signal having a raster scanned format, that is, said video signal is one being constituted by a plurality of line signals each having a pre-determined line period, said apparatus comprising:

a two-dimensional filter having a transfer function $H(z_1,z_2)$ given by $$H(z_1, z_2) = \frac{Y(z_1, z_2)}{X(z_1, z_2)} = \frac{\sum_{i=0}^{M}\sum_{j=0}^{N} a_{ij}X(z_1, z_2)z_1^{-i}z_2^{-j}}{\sum_{i=0}^{M}\sum_{j=0}^{N} b_{ij}Y(z_1, z_2)z_1^{-i}z_2^{-j}}$$

wherein $\{a_{ij}\}$ and $\{b_{ij}\}$ are the filter coefficients chosen to select the desired two-dimensional frequency response in regards to magnitude and phase, M and N are integers greater than zero, denoting limits of summation corresponding to the order of the filter, $z_1$ and $z_2$ are the standard z-plane variables, $X(z_1,z_2)$ is the input signal to said two-dimensional filter and $Y(z_1,z_2)$ is the output signal of said two-dimensional filter;

said two-dimensional filter comprising:

at least one line delay means (1H) imparting a delay equal to substantially one horizontal line scanning period of said raster scanned signal;

one adding means for generating the output $Y(z_1,z_2)$ as a sum of M partial results;

a plurality of signal processing modules of a first kind called type I processing elements, each type I processing element being comprised of:

first input signal line denoted $X_{IN}$, second input signal line denoted $Y_{IN}$, third input signal line denoted $Y'_{IN}$, which receives the output signal of another processing element or the zero signal, first multiplier means for multiplying the first input signal by a first coefficient ($a_{ij}$), second multiplier means for multiplying the second input signal by a second coefficient ($b_{ij}$), adding means for adding together the output signals of said first and second multiplier means and said third input signal line, delay means for delaying the output signal of the said delay means by a time period T;

a plurality of signal processing modules of a second kind called type II processing elements, each type II processing element being comprised of:

first input signal line denoted $X_{IN}$, second input signal line denoted $Y_{IN}$, third input signal line denoted $Y'_{IN}$, which receives the output signal of another processing element, first multiplier means for multiplying the first input signal by a first coefficient ($a_{i0}$), second multiplier means for multiplying the second input signal by a second coefficient ($b_{i0}$), adding means for adding together the output signals of said first and second multiplier means and said third input signal line;

wherein, said at least one line delay means (1H), said one adding means for generating the output $Y(z_1,z_2)$ as a sum of M partial results, said plurality of processing elements of a first kind and said plurality of signal processing elements of a second kind are interconnected to implement said transfer function of said two-dimensional filter.

3. Apparatus in accordance with claim 1 wherein each of said multiplier means in each of said processing elements performs unsigned multiplications so that at least one inverting means must be included in said signal processing apparatus in order to satisfy said transfer function.

4. Apparatus in accordance with claim 2 wherein each of said multiplier means in each of said type I and type II processing elements performs unsigned multiplications so that at least one inverting means must be included in said signal processing apparatus in order to satisfy said transfer function.

5. Apparatus in accordance with claim 1 wherein means for setting an initial condition is provided for said delay means in each of said processing elements.

6. Apparatus in accordance with claim 2 wherein means for setting an initial condition is provided for said delay means in each of said processing elements of type I.

7. Apparatus in accordance with claim 1 wherein the order of the filtering is given by $M=N=2$.

8. Apparatus in accordance with claim 2 wherein the order of the filtering is given by $M=N=2$.

9. Apparatus in accordance with claim 2 wherein each of said line delay means is of the charge-coupled device type in which signals transferred internally within said charge-coupled device are in the form of electrical charge representative of said signals.

* * * * *